(12) United States Patent
Chang et al.

(10) Patent No.: US 9,356,249 B2
(45) Date of Patent: May 31, 2016

(54) ORGANIC ELECTRONIC DEVICE AND ELECTRIC FIELD-INDUCED CARRIER GENERATION LAYER

(71) Applicant: Industrial Technology Research Institute, Hsinchu (TW)

(72) Inventors: Yi-Ming Chang, Hsinchu (TW); Chih-Ming Lai, Changhua County (TW); Chen-Kun Chen, Hsinchu County (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 14/501,029

(22) Filed: Sep. 30, 2014

(65) Prior Publication Data

US 2016/0093822 A1 Mar. 31, 2016

(51) Int. Cl.
*H01L 51/00* (2006.01)
*H01L 51/50* (2006.01)

(52) U.S. Cl.
CPC ........ *H01L 51/5008* (2013.01); *H01L 51/0072* (2013.01); *H01L 51/5012* (2013.01); *H01L 51/5056* (2013.01); *H01L 51/5072* (2013.01); *H01L 51/5088* (2013.01); *H01L 51/5092* (2013.01); *H01L 2251/301* (2013.01); *H01L 2251/303* (2013.01)

(58) Field of Classification Search
CPC ............ H01L 51/5036; H01L 51/5278; H01L 51/5206; H01L 51/5272
See application file for complete search history.

(56) References Cited

U.S. PATENT DOCUMENTS

| 5,707,745 | A | 1/1998 | Forrest et al. |
| 6,107,734 | A | 8/2000 | Tanaka et al. |
| 6,337,492 | B1 | 1/2002 | Jones et al. |
| 7,126,267 | B2 | 10/2006 | Liao et al. |
| 7,273,663 | B2 | 9/2007 | Liao et al. |
| 8,017,254 | B2 | 9/2011 | Itai |
| 8,080,934 | B2 | 12/2011 | Kido et al. |
| 8,564,190 | B2 | 10/2013 | Seo et al. |
| 2003/0189401 | A1* | 10/2003 | Kido ............. C07C 211/58 313/504 |
| 2007/0205411 | A1* | 9/2007 | Itai ............. H01L 51/5278 257/40 |
| 2011/0266528 | A1* | 11/2011 | Langer ......... C07D 405/04 257/40 |
| 2012/0126208 | A1 | 5/2012 | Kawamura et al. |
| 2014/0048785 | A1 | 2/2014 | Heuser et al. |

(Continued)

FOREIGN PATENT DOCUMENTS

| CN | 101714613 | 5/2010 |
| TW | 201411898 | 3/2014 |
| WO | 2013164761 | 11/2013 |

OTHER PUBLICATIONS

Hyeseung Kang, et al., "Interface Electronic Structure of a Strongly Electron Withdrawing Molecule on an Indium-tin-oxide Surface," Journal of the Korean Physical Society, vol. 59, No. 5, Nov. 2011, pp. 3060-pp. 3063.

(Continued)

*Primary Examiner* — Mohammad Islam
*Assistant Examiner* — Christina Sylvia
(74) *Attorney, Agent, or Firm* — Jianq Chyun IP Office (57) ABSTRACT

An electric field-induced carrier generation layer including a p-type material and an n-type material is provided. The p-type material and the n-type material are alternately distributed in at least one direction different from a thickness direction of the electric field-induced carrier generation layer. An organic electronic device is also provided.

23 Claims, 5 Drawing Sheets

(56) References Cited

U.S. PATENT DOCUMENTS

2015/0090984 A1* 4/2015 Kang ............... H01L 51/5278
257/40
2015/0194624 A1* 7/2015 Jeong ............... H01L 51/5072
257/40

OTHER PUBLICATIONS

Xiaoming Wu, et al., "C60/N,N-bis(1-naphthyl)-N,N-diphenyl-1,1-biphenyl-4,4-diamine:MoO3 as the interconnection layer for high efficient tandem blue fluorescent organic light-emitting diodes," Applied Physics Letters, vol. 102, Feb. 2013, pp. 243302-1-pp. 243302-4.

Takayuki Chiba, et al., "Ultra-high efficiency by multiple emission from stacked organic light-emitting devices," Organic Electronics, vol. 12, Jan. 2011, pp. 710-pp. 715.

Sami Hamwi, et al., "The Role of Transition Metal Oxides in Charge-Generation Layers for Stacked Organic Light-Emitting Diodes," Advanced Functional Materials, vol. 20, Feb. 2010, pp. 1762-pp. 1766.

Kyoung Soo Yook, et al., "Highly Efficient p-i-n and Tandem Organic Light-Emitting Devices Using an Air-Stable and Low-Temperature-Evaporable Metal Azide as an n-Dopant," Advanced Functional Materials, vol. 20, Jan. 2010, pp. 1797-pp. 1802.

Yong-Ki Kim, et al., "Energy level alignment at a charge generation interface between 4,4-bis(N-phenyl-1-naphthylamino)biphenyl and 1,4,5,8,9,11-hexaazatriphenylenehexacarbonitrile," Applied Physics Letters, vol. 94, Nov. 2008, pp. 063305-1-pp. 063305-3.

Woo Sik Jeon, et al., "High current conduction with high mobility by non-radiative charge recombination interfaces in organic semiconductor devices," Organic Electronics, vol. 13, Jun. 2011, pp. 939-pp. 944.

Ehsan Najafabadi, et al., "High-performance inverted top-emitting green electrophosphorescent organic light-emitting diodes with a modified top Ag anode," Organic Electronics, vol. 14, Mar. 2013, pp. 1271-pp. 1275.

* cited by examiner

ORGANIC ELECTRONIC DEVICE AND ELECTRIC FIELD-INDUCED CARRIER GENERATION LAYER

TECHNICAL FIELD

The technical field relates to an organic electronic device and an electric field-induced carrier generation layer.

BACKGROUND

In the solid state lighting technology, although the light emitting efficiency of the organic solid state lighting, e.g., the organic light-emitting diode (OLED) lighting, is less than that of the inorganic solid state lighting, e.g., the light-emitting diode (LED) lighting, the OLED lighting has some unique properties. For example, the OLED is easy to be manufactured as a surface light source, may be light and thin, may not emit ultraviolet (UV) or infrared (IR), and may not contain mercury. Moreover, the spectra of the OLEDs are closer to that of natural light.

On the other hand, there are many issues related to the organic solid state lighting. For example, the life time of the lighting device should be improved. Moreover, when the organic solid state lighting is used in the illumination application, it needs to operate in the state of high brightness, so that it is urgent to improve the light emitting efficiency of the organic solid state. A tandem device is one of the solutions to improve both the life time and the brightness.

SUMMARY

One of exemplary embodiments provides an organic electronic device including a first electrode, a second electrode, a plurality of organic light-emitting units, and an electric field-induced carrier generation layer. The organic light-emitting units are disposed between the first electrode and the second electrode. The electric field-induced carrier generation layer is disposed between two adjacent organic light-emitting units and includes a p-type material and an n-type material alternately distributed in at least one direction different from a direction from the first electrode to the second electrode and different from a direction from the second electrode to the first electrode.

One of exemplary embodiments provides an electric field-induced carrier generation layer including a p-type material and an n-type material. The p-type material and the n-type material are alternately distributed in at least one direction different from a thickness direction of the electric field-induced carrier generation layer.

Several exemplary embodiments accompanied with figures are described in detail below to further describe the disclosure in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DETAILED DESCRIPTION OF DISCLOSED EMBODIMENTS

Figure 1A:
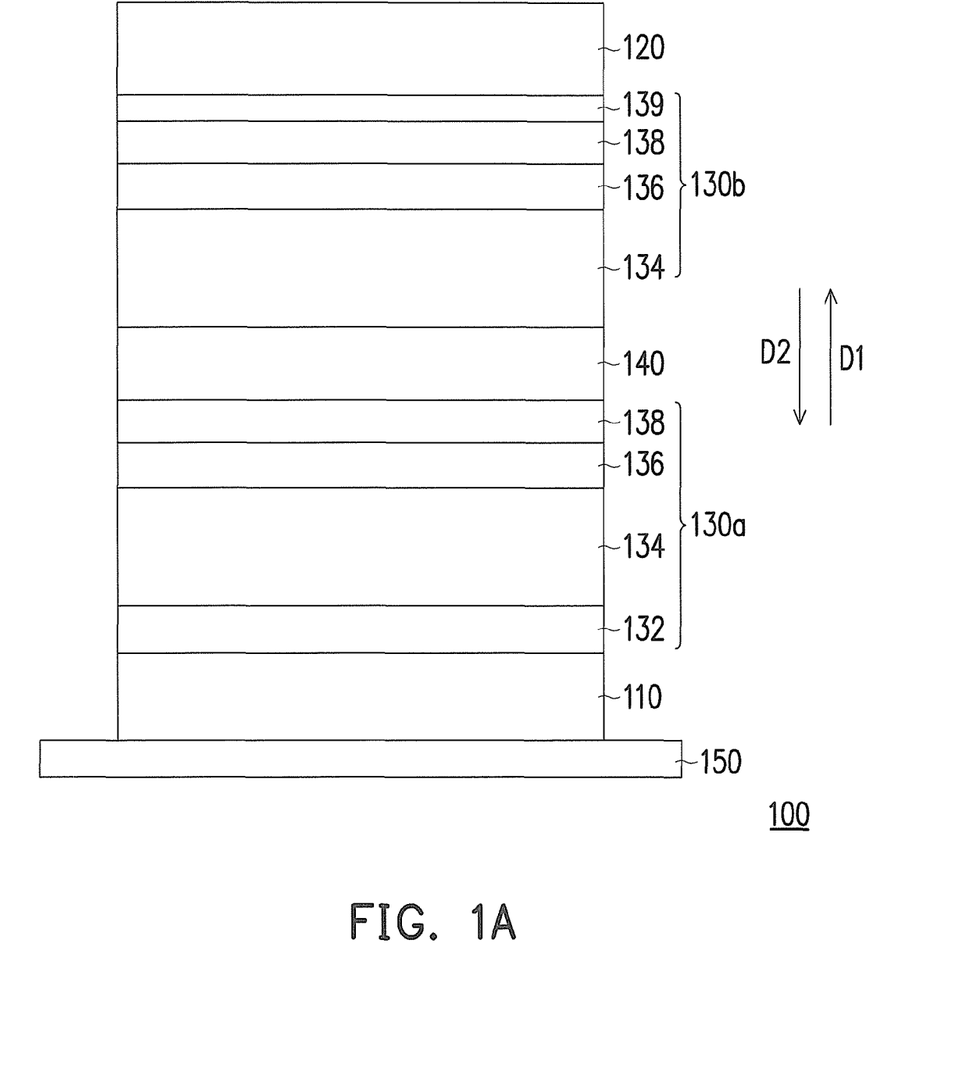
FIG. 1A is a schematic cross-sectional view of an organic electronic device according to an exemplary embodiment.
Figure 1B:
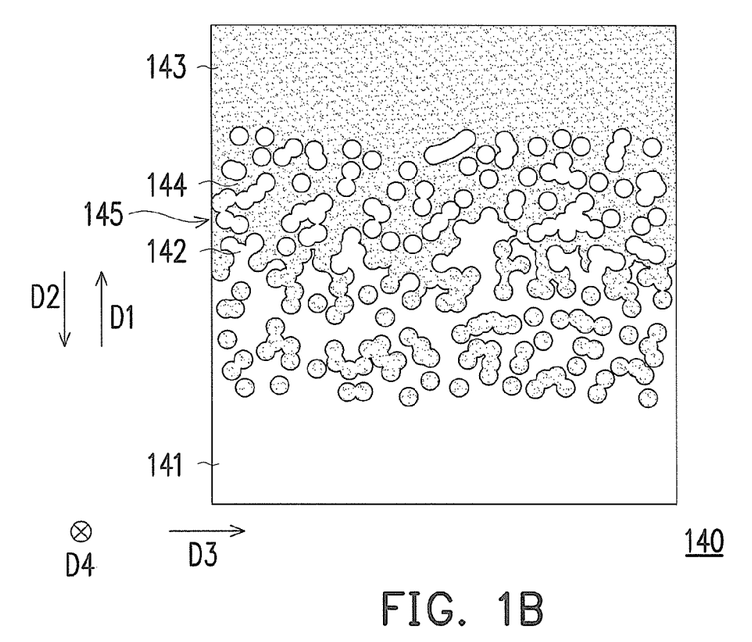
FIG. 1B is a schematic enlarged view of the electric field-induced carrier generation layer in FIG. 1A.

FIG. 1A is a schematic cross-sectional view of an organic electronic device according to an exemplary embodiment, and FIG. 1B is a schematic enlarged view of the electric field-induced carrier generation layer in FIG. 1A. Referring to FIGS. 1A and 1B, an organic electronic device 100 in this embodiment includes a first electrode 110, a second electrode 120, a plurality of organic light-emitting units 130a and 130b, and an electric field-induced carrier generation layer 140. The organic light-emitting units 130a and 130b are disposed between the first electrode 110 and the second electrode 120. The electric field-induced carrier generation layer 140 is disposed between two adjacent organic light-emitting units 130a and 130b and includes a p-type material 144 and an n-type material 142 alternately distributed in at least one direction different from a direction D1 from the first electrode 110 to the second electrode 120 and different from a direction D2 from the second electrode 120 to the first electrode 110. Each of the direction D1 and the direction D2 is the thickness direction of the electric field-induced carrier generation layer 140. In this embodiment, the p-type material 144 and the n-type material 142 are alternately distributed in all directions. For example, the p-type material 144 and the n-type material 142 are alternately distributed in the direction D1, the direction D2, a direction D3, and a direction D4, wherein the direction D3 and direction D4 are perpendicular to the direction D1, and the direction D3 is perpendicular to the direction D4.

In this embodiment, each of the organic light-emitting units 130a and 130b includes a plurality of organic semiconductor layers. For example, the organic light-emitting unit 130a may include a hole injection layer 132, a hole transport layer 134, an emitting layer 136, and an electron transport layer 138, which are organic semiconductor layers, stacked from the side close to the first electrode 110 to the side close to the second electrode 120. On the other hand, the organic light-emitting unit 130b may include a hole transport layer 134, an emitting layer 136, an electron transport layer 138, and an electron injection layer 139, which are organic semiconductor layers, stacked from the side close to the first electrode 110 to the side close to the second electrode 120.

The materials of the aforementioned organic semiconductor layers may be the organic materials used in an organic light-emitting diode (OLED).

The electric field-induced carrier generation layer 140 is a charge generation layer (CGL). In this embodiment, at least a part of the p-type material 144 and at least a part of the n-type material 142 are mixed randomly in three-dimensional directions. For example, in FIG. 1B, a part of the p-type material 144 and a part of the n-type material 142 are mixed randomly in three-dimensional directions. In this embodiment, the electric field-induced carrier generation layer 140 includes an n-type material layer 141, a p-type material layer 143, and a p-type and n-type hybrid layer 145. The n-type material layer 141 is disposed between the first electrode 110 and the second electrode 120 and includes a part of the n-type material 142. The p-type material layer 143 is disposed between the n-type material layer 142 and the second electrode 120 and includes a part of the p-type material 144. The p-type and n-type hybrid layer 145 includes another part of the n-type material 142 and another part of the p-type material 144 randomly distributed in three-dimensional space. However, in some other embodiments, all the n-type material 142 and all the p-type material 144 in the electric field-induced carrier generation layer 140 may be randomly distributed in three-dimensional space.

In this embodiment, since the p-type material 144 and the n-type material 142 are alternately distributed in at least one direction different from the direction D1 and different from the direction D2, e.g., the n-type material 142 and the p-type material 144 are randomly distributed in three-dimensional space, therefore a plurality of p-n junctions, i.e. the interfaces between the n-type material 142 and the p-type material 144, are arranged along the at least one direction in which the p-type material and the n-type material are alternately distributed. In FIG. 1B, there are p-n junctions arranged along all directions. In other words, since the electric field-induced carrier generation layer 145 includes the p-type material 144 and the n-type material 142 alternately distributed in at least one direction different from the direction D1 and different from the direction D2, the total area of the p-n junctions of the p-type material 144 and the n-type material 142 are effectively increased with respect to the total area of a plane p-n junction between a plane p-type material layer and a plane n-type material layer. When there is a voltage difference between the first electrode 110 and the second electrode 120, an electric field penetrates through the electric field-induced carrier generation layer 140, and more electrons and more holes are generated and separated due to the increase of the total area of the p-n junctions. Specifically, more electrons are transported to the light-emitting unit 130a, and more holes are transported to the light-emitting unit 130b. As a result, the carrier separation efficiency of the electric field-induced carrier generation layer 140 is increased, and the capability of the electron and hole injection to two adjacent light-emitting units 130a and 130b is increased, so as to increase the current efficiency of the organic electronic device 100. In this embodiment, the p-n junctions are heterojunctions.

In this embodiment, the p-type material 144 includes a hole transport material mixed with an electron accepting material, and the n-type material 142 includes an electron transport material mixed with an electron donor material. The electron donor material may include an alkali metal, an alkaline earth metal, an alkali metal compound, an alkaline earth metal compound, or a combination thereof. In this embodiment, the electron donor material may include Be, Mg, Ca, Li, LiF, 8-hydroxy-quinolinato lithium (Liq), Cs$_2$CO$_3$, or a combination thereof. The electron accepting material may include 1,4,5,8,9,11-hexaazatriphenylene-hexanitrile (HATCH), MoO$_3$, V$_2$O$_5$, WO$_3$, or a combination thereof.

In this embodiment, the organic electronic device 100 may further include a substrate 150, and the first electrode 110, the light-emitting unit 130a, the electric field-induced carrier generation layer 140, the light-emitting unit 130b and the second electrode 120 are stacked in sequence on the substrate 150. The substrate 150 may be a soda lime glass substrate, willow glass, flexible thin-glass, high-refractive index glass (the index of refraction thereof is greater than 1.7), polyester (PET), Polyethylene naphthalate (PEN), polyimide (PI), or the above substrate with light out-coupling structures. The first electrode 110 may be made of indium tin oxide (ITO); doped zinc oxide such as indium zinc oxide (IZO), aluminum zinc oxide AZO), or gallium zinc oxide (GZO); graphene; carbon nanotube (CNT); PEDOT:PSS; or any combination thereof. The second electrode 120 may be made of aluminum, silver, or the combination thereof. In this embodiment, the first electrode 110 is an anode, and the second electrode 120 is a cathode. The hole injection layer 132 may be made of PEDOT:PSS, HATCN, or transparent metal oxide such as MoO$_3$, V$_2$O$_5$, or WO$_3$. The hole transport layer 134 and the aforementioned hole transport material of the p-type material 144 may be made of N,N'-bis(naphthalen-1-yl)-N,N'-bis(phenyl)-2,2'-dimethylbenzidine (α-NPD), N,N'-bis(naphthalen-1-yl)-N,N'-bis(phenyl)-benzidine (NPB), Di-[4-(N, N-ditolyl-amino)-phenyl]cyclohexane (TAPC), (2,3,5,6-Tetrafluoro-2,5-cyclohexadiene-1,4-diylidene) dimalononitrile, 7,7,8,8-Tetracyano-2,3,5,6-tetrafluoroquinodimethane (F4-TCNQ), N,N,N',N'-tetrakis (4-methoxyphenyl)benzidine (MEO-TPD) or bi-layer arrangement with any combination thereof. The emitting layer 136 may be made of phosphorescent light emitting host material such as 4,4',4"-tris(carbazol-9-yl)triphenylamine (TCTA), NPB, 2,2',2"-(1,3,5-benzinetriyl)-tris(1-phenyl-1-H-benzimidazole) (TBPi), 1,3-Bis(N-carbazolyl)benzene (mCP), 4,4'-bis(carbazol-9-yl)biphenyl (CBP), 1,3-bis(triphenylsilyl)benzene (UGH), 9,9'-(5-(triphenylsilyl)-1,3-phenylene)bis(9H-carbazole) (SimCP), 2,6-bis(3-(9H-carbazol-9-yl)phenyl)pyridine (26DCzPPy), or 9,9-spirobifluoren-2-yl-diphenyl-phosphine oxide (SPPO1) doped with phosphorescent emitter dopant such as Firpic, FIr6, Ir(ppy)3, Ir(ppy)2acac, Ir(pq)2acac, or Ir(MDQ)2acac. The emitting layer 136 can be made of blue fluorescent light emitting materials such as 4,4'-Bis(2,2-diphenyl-ethen-1-yl)biphenyl (DPVBi), 4,4'-bis(9-ethyl-3-carbazovinylene)-1,1'-biphenyl (BCzVBi), N,N'-di-(1-naphthalenyl)-N,N-diphenyl-[1,1':4', 1":4",1"'-quaterphenyl]-4,4"'-diamine (4PNPD), p-bis p-N, N-diphenylaminostyryl benzene (DSA-Ph), BUBD-1, or 2-methyl-9,10-di 2-naphthyl anthracene (MADN). The emitting layer 136 can also be made of combination blue fluorescent light emitting layers and green/red or yellow/red phosphorescent light emitting layers to form a white organic light emitting diode. The electron transport layer 138 and the aforementioned electron transport material of the n-type material 142 may be made of Tris-(8-hydroxyquinoline)aluminum (Alq3), 4,7-Diphenyl-1,10-phenanthroline (Bphen), 2,9-dimethyl-4,7 diphenyl-1,10-phenanthroline (BCP), TBPi, 3-(Biphenyl-4-yl)-5-(4-tert-butylphenyl)-4-phenyl-4H-1,2,4-triazole (TAZ), 1,3,5-Tri(m-pyrid-3-yl-phenyl) benzene (TmPyPB), bis-1,2-(3,5-di-3-pyridyl-phenyl)benzene (B3PyPB) or any combination thereof. The electron transport layer 138 and the aforementioned electron transport material of the n-type material 142 may be doped with Cs, CsCO3, Li, Liq. The electron injection layer 139 may be made of LiF, Aluminum, Liq, Mg, Ca.

In some other embodiments, the p-type material 144 is the aforementioned electron accepting material and does not include the aforementioned hole transport material. Moreover, the n-type material 142 may be the aforementioned electron donor material and does not include the aforementioned electron transport material.

In this embodiment, the weight ratio of the part of the p-type material 144 to the part of the n-type material 142 in the p-type and n-type hybrid layer 145 ranges from 0.05 to 99. Since the mobility of holes is greater than that of electrons, when the aforementioned weight ratio greater than 1, the amount of the electrons injected into the electron transport layer 138 of the light-emitting unit 130a is better balanced with the amount of the holes injected into the hole transport layer 134 of the light-emitting unit 130b.

In this embodiment, the electric field-induced carrier generation layer 140 does substantially not absorb light, e.g., visible light, emitted from the organic light-emitting units 130a and 130b to generate charge carriers, but the electric field-induced carrier generation layer 140 generates charge carriers due to a voltage difference between the first electrode 110 and the second electrode 120 or due to a voltage difference between two opposite surfaces of the electric field-induced carrier generation layer 140 (e.g., the surface facing the first electrode 110 and the surface facing the second electrode 120). As a result, the electric field-induced carrier generation layer 140 may not reduce the light extraction efficiency of the organic electronic device 100.

Figure 2:
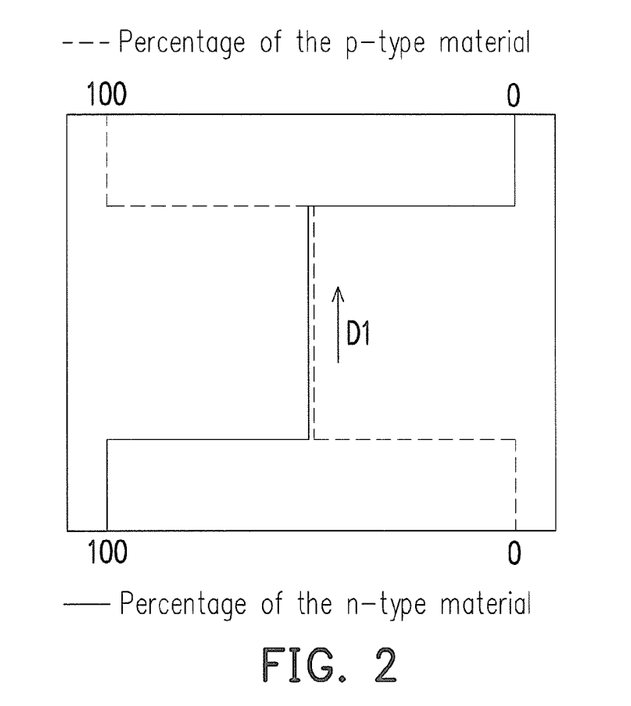
FIG. 2 shows the schematic weight percentage distribution of the n-type material and the p-type material in electric field-induced carrier generation layer along the direction D1 in FIG. 1B.

FIG. 2 shows the schematic weight percentage distribution of the n-type material and the p-type material in electric field-induced carrier generation layer 140 along the direction D1 in FIG. 1B. Referring to FIG. 2, since the p-type material 144 and the n-type material 142 are randomly distributed in three-dimensional space in the p-type and n-type hybrid layer 145, the weight percentages of the n-type material 142 and the p-type material 144 are about 50% and about 50%, respectively. In some other embodiments, the weight percentage of the n-type material 142 may be less than 50%, and the weight percentage of the p-type material 144 may be greater than 50%.

Figure 3A:
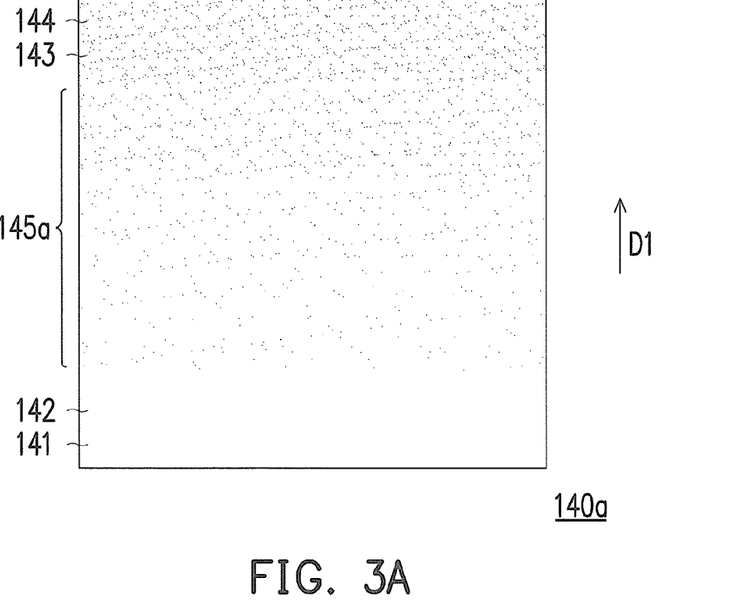
FIG. 3A is a schematic enlarged view of the electric field-induced carrier generation layer in another exemplary embodiment.
Figure 3B:
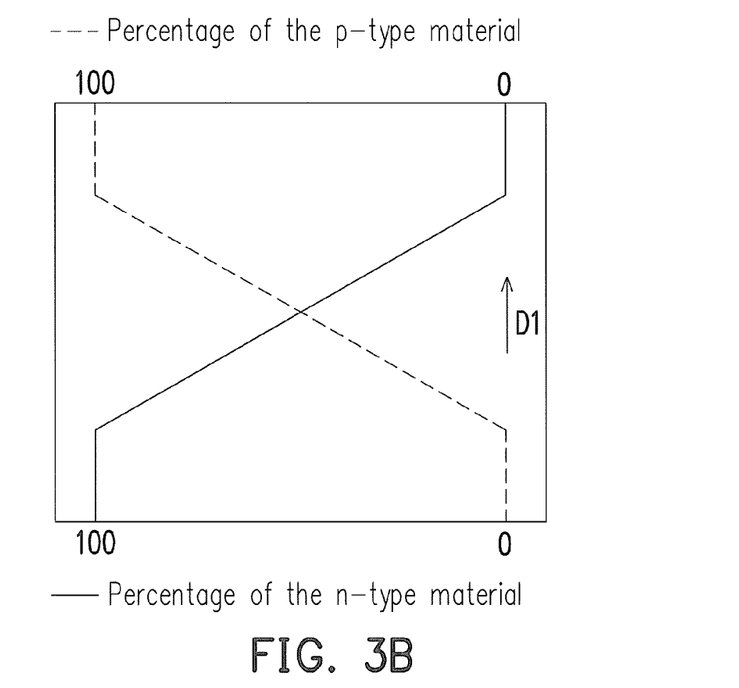
FIG. 3B shows the schematic weight percentage distribution of the n-type material and the p-type material in electric field-induced carrier generation layer along the direction D1 in FIG. 3A.

FIG. 3A is a schematic enlarged view of the electric field-induced carrier generation layer 140a in another exemplary embodiment, and FIG. 3B shows the schematic weight percentage distribution of the n-type material 142 and the p-type material 144 in electric field-induced carrier generation layer 140a along the direction D1 in FIG. 3A. Referring to FIGS. 3A and 3B, the electric field-induced carrier generation layer 140a in this embodiment may be used to replace the electric field-induced carrier generation layer 140 in FIG. 1A. The electric field-induced carrier generation layer 140a is similar to the electric field-induced carrier generation layer 140 in FIG. 1A, and the difference therebetween is as follows.

In this embodiment, the part of the p-type material 144 and the part of the n-type material 142 in the p-type and n-type hybrid layer 145a are mixed in three-dimensional directions, and the proportion of the part of the p-type material 144 to the part of the n-type material 142 gradually increases along the direction D1. As a result, the total area of the p-n junctions is also increased.

Figure 4:
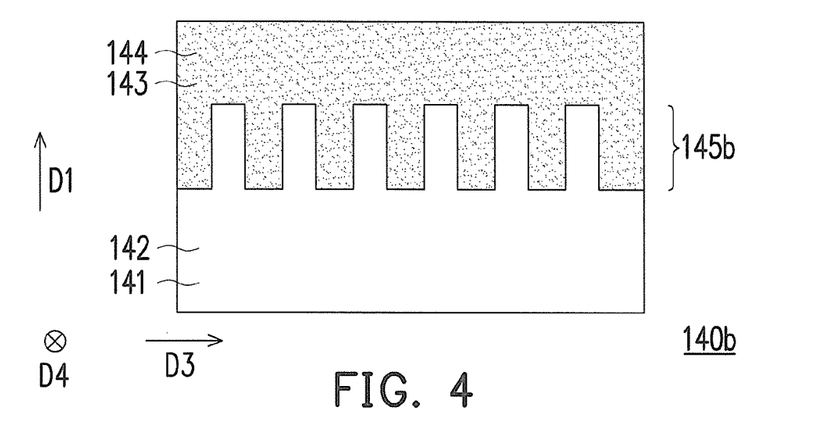
FIG. 4 is a schematic enlarged view of the electric field-induced carrier generation layer in another exemplary embodiment.

FIG. 4 is a schematic enlarged view of the electric field-induced carrier generation layer 140b in another exemplary embodiment. Referring to FIG. 4, the electric field-induced carrier generation layer 140b in this embodiment may be used to replace the electric field-induced carrier generation layer 140 in FIG. 1A. The electric field-induced carrier generation layer 140b is similar to the electric field-induced carrier generation layer 140 in FIG. 1A, and the difference therebetween is as follows.

In this embodiment, the part of the p-type material 144 and the part of the n-type material 142 in the p-type and n-type hybrid layer 145b are alternately arranged along at least one direction (e.g., the direction D3, the direction D4, or a combination thereof) perpendicular to the direction D1. As a result, the total area of the p-n junctions is also increased.

Figure 5:
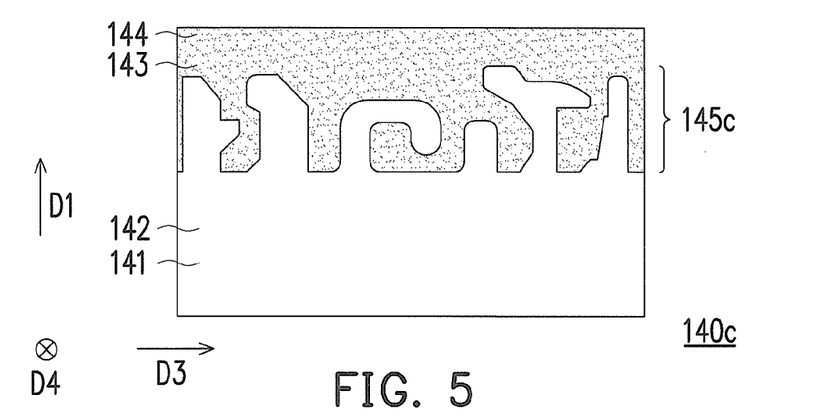
FIG. 5 is a schematic enlarged view of the electric field-induced carrier generation layer in another exemplary embodiment.

FIG. 5 is a schematic enlarged view of the electric field-induced carrier generation layer 140c in another exemplary embodiment. Referring to FIG. 5, the electric field-induced carrier generation layer 140c in this embodiment may be used to replace the electric field-induced carrier generation layer 140 in FIG. 1A. The electric field-induced carrier generation layer 140c is similar to the electric field-induced carrier generation layer 140b in FIG. 4, and the difference therebetween is as follows.

The distribution of the p-type material 144 and the n-type material 142 in the p-type and n-type hybrid layer 145b in FIG. 4 is more ordered. However, the distribution of the p-type material 144 and the n-type material 142 in the p-type and n-type hybrid layer 145c in FIG. 5 is more random. As a result, the total area of the p-n junctions is also increased.

Figure 6:
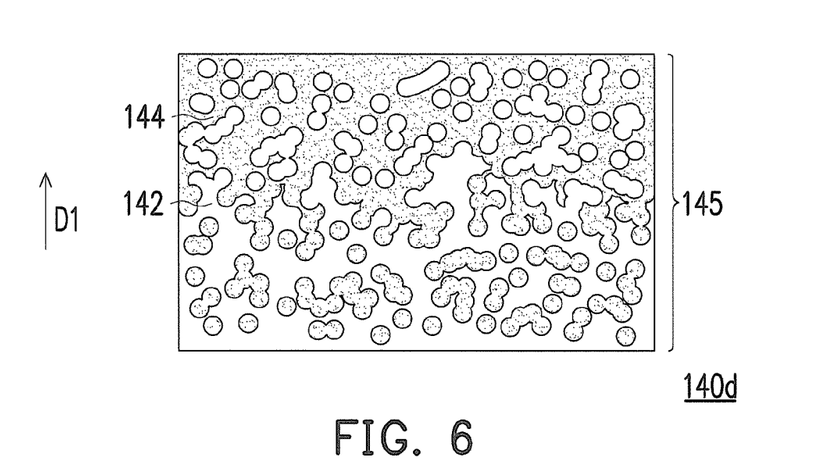
FIG. 6 is a schematic enlarged view of the electric field-induced carrier generation layer in another exemplary embodiment.

FIG. 6 is a schematic enlarged view of the electric field-induced carrier generation layer 140d in another exemplary embodiment. Referring to FIG. 6, the electric field-induced carrier generation layer 140d in this embodiment may be used to replace the electric field-induced carrier generation layer 140 in FIG. 1A. The electric field-induced carrier generation layer 140d is similar to the electric field-induced carrier generation layer 140 in FIG. 1A, and the difference therebetween is as follows.

In this embodiment, the electric field-induced carrier generation layer 140d has the p-type and n-type hybrid layer 145, but does not have the n-type material layer 141 and the p-type material layer 143. Similarly, in some other embodiments, the electric field-induced carrier generation layer 140a as shown in FIG. 3A may have the p-type and n-type hybrid layer 145a, but does not have the n-type material layer 141 and the p-type material layer 143. In some other embodiments, the electric field-induced carrier generation layer 140b as shown in FIG. 4 may have the p-type and n-type hybrid layer 145b, but does not have the n-type material layer 141 and the p-type material layer 143. Moreover, in some other embodiments, the electric field-induced carrier generation layer 140c as shown in FIG. 5 may have the p-type and n-type hybrid layer 145c, but does not have the n-type material layer 141 and the p-type material layer 143.

Figure 7:
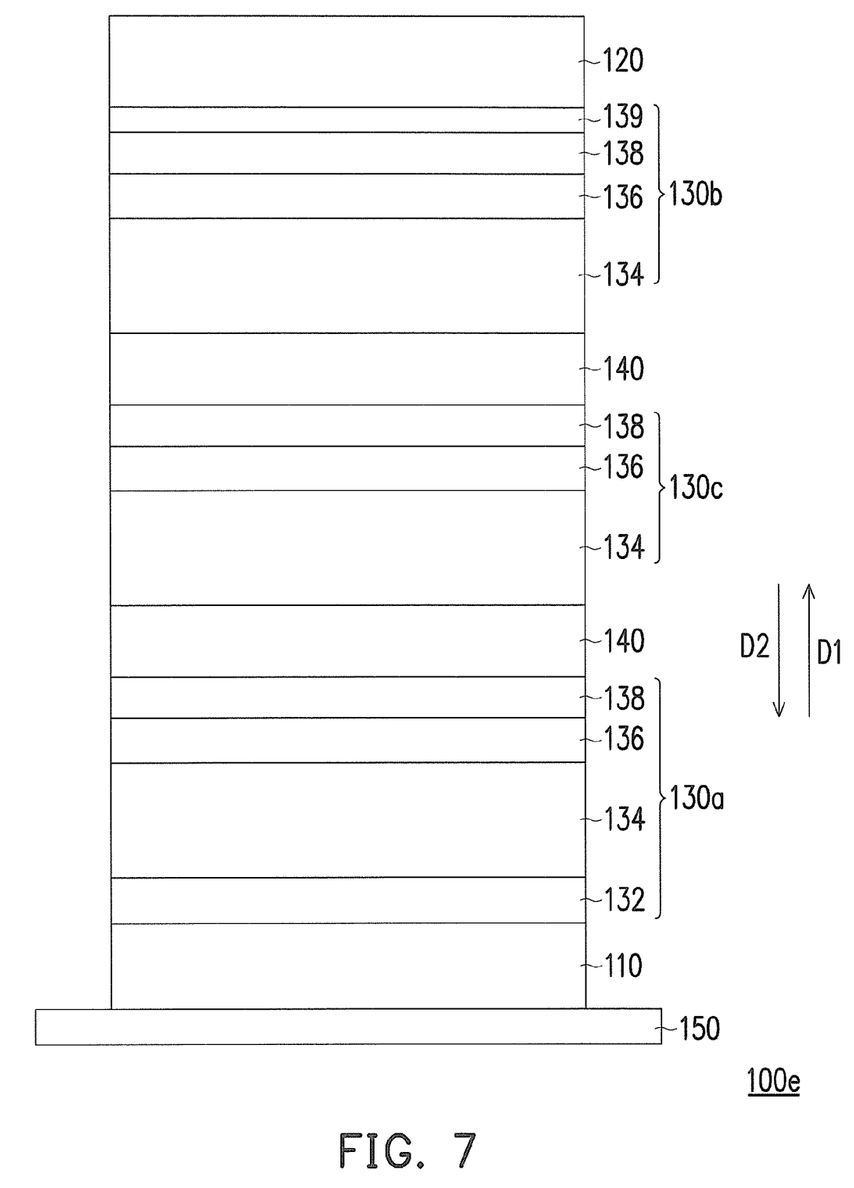
FIG. 7 is a schematic cross-sectional view of an organic electronic device according to another exemplary embodiment.

FIG. 7 is a schematic cross-sectional view of an organic electronic device 100e according to another exemplary embodiment. Referring to FIG. 7, the organic electronic device 100e in FIG. 7 is similar to the organic electronic device 100 in FIG. 1A, and the difference therebetween is as follows. In this embodiment, the organic electronic device 100e includes three light-emitting units 130a, 130c, and 130b stacked along the direction D1 and two electric field-induced carrier generation layers 140 respectively disposed between the light-emitting units 130a and 130c and between the light-emitting units 130c and 130b. The light emitting unit 130c may include a hole transport layer 134, an emitting layer 136, and an electron transport layer 138 stacked along the direction D1. In some other embodiments, the number of the light-emitting units 130c may be more than one, and for every two adjacent light-emitting units 130c, there is an electric field-induced carrier generation layers 140 disposed therebetween.

In conclusion, in the organic electronic device and the electric field-induced carrier generation layer according to the exemplary embodiments, since the p-type material and the n-type material are alternately distributed in at least one direction different from a thickness direction of the electric field-induced carrier generation layer, the total area of the p-n junction between the p-type material and the n-type material is effectively increased. As a result, carrier separation efficiency of the electric field-induced carrier generation layer is increased, and the capability of the electron and hole injection to two adjacent light-emitting units is increased, so as to increase the current efficiency of the organic electronic device.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. An organic electronic device comprising:
   a first electrode;
   a second electrode;
   a plurality of organic light-emitting units disposed between the first electrode and the second electrode; and
   an electric field-induced carrier generation layer disposed between two adjacent organic light-emitting units and comprising a p-type material and an n-type material alternately distributed in at least one direction different from a direction from the first electrode to the second electrode and different from a direction from the second electrode to the first electrode, wherein a weight ratio of the at least one part of the p-type material to the at least one part of the n-type material ranges from 0.05 to 99.

2. The organic electronic device according to claim 1, wherein a plurality of p-n junctions are arranged along the at least one direction in which the p-type material and the n-type material are alternately distributed.

3. The organic electronic device according to claim 1, wherein at least one part of the p-type material and at least one part of the n-type material are mixed randomly in three-dimensional directions.

4. The organic electronic device according to claim 1, wherein at least one part of the p-type material and at least one part of the n-type material are mixed in three-dimensional directions, and a proportion of the at least one part of the p-type material to the at least one part of the n-type material gradually increases along a direction from the first electrode to the second electrode.

5. The organic electronic device according to claim 1, wherein the electric field-induced carrier generation layer comprises:
   an n-type material layer disposed between the first electrode and the second electrode and comprising a part of the n-type material;
   a p-type material layer disposed between the n-type material layer and the second electrode and comprising a part of the p-type material; and
   a p-type and n-type hybrid layer comprising another part of the n-type material and another part of the p-type material alternately arranged along at least one direction perpendicular to the direction from the first electrode to the second electrode.

6. The organic electronic device according to claim 1, wherein the electric field-induced carrier generation layer comprises:
   an n-type material layer disposed between the first electrode and the second electrode and comprising a part of the n-type material;
   a p-type material layer disposed between the n-type material layer and the second electrode and comprising a part of the p-type material; and
   a p-type and n-type hybrid layer comprising another part of the n-type material and another part of the p-type material randomly distributed in three-dimensional space.

7. The organic electronic device according to claim 1, wherein each of the organic light-emitting units comprises a plurality of organic semiconductor layers.

8. The organic electronic device according to claim 1, wherein the p-type material comprises a hole transport material mixed with an electron accepting material, and the n-type material comprises an electron transport material mixed with an alkali metal, an alkaline earth metal, an alkali metal compound, an alkaline earth metal compound, or a combination thereof.

9. The organic electronic device according to claim 8, wherein the electron accepting material comprises HATCN, $MoO_3$, $V_2O_5$, $WO_3$, or a combination thereof.

10. The organic electronic device according to claim 8, wherein the electron transport material is mixed with Be, Mg, Ca, Li, LiF, 8-hydroxy-quinolinato lithium, $Cs_2CO_3$, or a combination thereof.

11. The organic electronic device according to claim 1, wherein the p-type material is an electron accepting material, and the n-type material is an electron donor material.

12. The organic electronic device according to claim 1, wherein the electric field-induced carrier generation layer does substantially not absorb light emitted from the organic light-emitting units to generate charge carriers, but the electric field-induced carrier generation layer generates charge carriers due to a voltage difference between the first electrode and the second electrode.

13. An electric field-induced carrier generation layer comprising:
   a p-type material; and
   an n-type material, the p-type material and the n-type material alternately distributed in at least one direction different from a thickness direction of the electric field-induced carrier generation layer, wherein a weight ratio of the at least one part of the p-type material to the at least one part of the n-type material ranges from 0.05 to 99.

14. The electric field-induced carrier generation layer according to claim 13, wherein a plurality of p-n junctions are arranged along the at least one direction in which the p-type material and the n-type material are alternately distributed.

15. The electric field-induced carrier generation layer according to claim 13, wherein at least one part of the p-type material and at least one part of the n-type material are mixed randomly in three-dimensional directions.

16. The electric field-induced carrier generation layer according to claim 13, wherein at least one part of the p-type material and at least one part of the n-type material are mixed in three-dimensional directions, and a proportion of the at least one part of the p-type material to the at least one part of the n-type material gradually increases along the thickness direction.

17. The electric field-induced carrier generation layer according to claim 13 comprising:
   an n-type material layer disposed between the first electrode and the second electrode and comprising a part of the n-type material;

a p-type material layer disposed between the n-type material layer and the second electrode and comprising a part of the p-type material; and a p-type and n-type hybrid layer comprising another part of the n-type material and another part of the p-type material alternately arranged along at least one direction perpendicular to the thickness direction.

18. The electric field-induced carrier generation layer according to claim 13, wherein the electric field-induced carrier generation layer comprises:

an n-type material layer disposed between the first electrode and the second electrode and comprising a part of the n-type material;

a p-type material layer disposed between the n-type material layer and the second electrode and comprising a part of the p-type material; and a p-type and n-type hybrid layer comprising another part of the n-type material and another part of the p-type material randomly distributed in three-dimensional space.

19. The electric field-induced carrier generation layer according to claim 13, wherein the p-type material comprises a hole transport material mixed with an electron accepting material, and the n-type material comprises an electron transport material mixed with an alkali metal, an alkaline earth metal, an alkali metal compound, an alkaline earth metal compound, or a combination thereof.

20. The electric field-induced carrier generation layer according to claim 19, wherein the electron accepting material comprises HATCN, $MoO_3$, $V_2O_5$, $WO_3$, or a combination thereof.

21. The electric field-induced carrier generation layer according to claim 19, wherein the electron transport material is mixed with Be, Mg, Ca, Li, LiF, 8-hydroxy-quinolinato lithium, $Cs_2CO_3$, or a combination thereof.

22. The electric field-induced carrier generation layer according to claim 13, wherein the p-type material is an electron accepting material, and the n-type material is an electron donor material.

23. The electric field-induced carrier generation layer according to claim 13, wherein the electric field-induced carrier generation layer does substantially not absorb visible light to generate charge carriers, but the electric field-induced carrier generation layer generates charge carriers due to a voltage difference between two opposite surfaces of the electric field-induced carrier generation layer.

* * * * *